(12) United States Patent
Kim (10) Patent No.: US 11,600,598 B2
(45) Date of Patent: *Mar. 7, 2023

(54) MANUFACTURING METHOD OF SEMICONDUCTOR DEVICE

(71) Applicant: SK hynix Inc., Icheon-si (KR)

(72) Inventor: Jin Ha Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 76 days.

This patent is subject to a terminal disclaimer.

(21) Appl. No.: 17/197,996

(22) Filed: Mar. 10, 2021

(65) Prior Publication Data

US 2021/0193627 A1 Jun. 24, 2021

Related U.S. Application Data

(63) Continuation of application No. 16/678,288, filed on Nov. 8, 2019, now Pat. No. 10,978,428.

(30) Foreign Application Priority Data

May 7, 2019 (KR) .......................... 10-2019-0053217

(51) Int. Cl.
*H01L 25/065* (2023.01)
*H01L 25/18* (2023.01)
(Continued)

(52) U.S. Cl.
CPC .......... *H01L 25/0657* (2013.01); *H01L 24/05* (2013.01); *H01L 24/08* (2013.01); *H01L 24/80* (2013.01); *H01L 25/162* (2013.01); *H01L 25/18* (2013.01); *H01L 25/50* (2013.01); *H01L 27/016* (2013.01); *H01L 2224/08145* (2013.01); *H01L 2224/80031* (2013.01); *H01L 2224/80039* (2013.01); *H01L 2224/80048* (2013.01); *H01L 2224/80895* (2013.01); *H01L 2224/80896* (2013.01); *H01L 2225/06524* (2013.01); *H01L 2924/1431* (2013.01); *H01L 2924/1434* (2013.01); *H01L 2924/30101* (2013.01)

(58) Field of Classification Search
CPC ...... H01L 24/05; H01L 25/162; H01L 27/016
USPC .................. 257/489, 656; 438/455, 474, 663
See application file for complete search history.

(56) References Cited

U.S. PATENT DOCUMENTS

| 6,605,830 B1 | 8/2003 | Kusunoki |
|---|---|---|
| 6,846,703 B2 | 1/2005 | Shimoda et al. |

(Continued)

FOREIGN PATENT DOCUMENTS

| CN | 107887395 A | 4/2018 |
|---|---|---|
| KR | 100325068 B1 | 8/2002 |

*Primary Examiner* — Calvin Lee
(74) *Attorney, Agent, or Firm* — William Park & Associates Ltd.

(57) ABSTRACT

A method of manufacturing a semiconductor device includes forming a cell chip including a first substrate, a source layer on the first substrate, a stacked structure on the source layer, and a channel layer passing through the stacked structure and coupled to the source layer, flipping the cell chip, exposing a rear surface of the source layer by removing the first substrate from the cell chip, performing surface treatment on the rear surface of the source layer to reduce a resistance of the source layer, forming a peripheral circuit chip including a second substrate and a circuit on the second substrate, and bonding the cell chip including the source layer with a reduced resistance to the peripheral circuit chip.

20 Claims, 10 Drawing Sheets

(51) Int. Cl.
*H01L 23/00* (2006.01)
*H01L 25/00* (2006.01)
*H01L 25/16* (2023.01)
*H01L 27/01* (2006.01)

(56) References Cited

U.S. PATENT DOCUMENTS

| | | |
|---|---|---|
| 9,455,263 B2 | 9/2016 | Zhang et al. |
| 2011/0058348 A1 | 3/2011 | Sakai et al. |

MANUFACTURING METHOD OF SEMICONDUCTOR DEVICE

CROSS-REFERENCE TO RELATED APPLICATION

The present application is a continuation application of U.S. patent application Ser. No. 16/678,288, filed on Nov. 8, 2019, now U.S. Pat. No. 10,978,428 issued on Apr. 13, 2021, and claims priority under 35 U.S.C. § 119(a) to Korean patent application number 10-2019-0053217, filed on May 7, 2019, in the Korean Intellectual Property Office, the entire disclosure of which is incorporated herein by reference.

BACKGROUND

1. Technical Field

Various embodiments of the present disclosure generally relate to an electronic device, and more particularly, to a method of manufacturing a semiconductor device.

2. Related Art

Non-volatile memory devices retain stored data regardless of power on/off conditions. The increase in integration density of two-dimensional non-volatile memory devices in which memory cells are formed in a single layer over a substrate has recently been limited. Thus, three-dimensional non-volatile memory devices have been proposed in which memory cells are stacked in a vertical direction over a substrate.

A three-dimensional non-volatile memory device may include interlayer insulating layers and gate electrodes that are stacked alternately with each other, and channel layers passing therethrough, with memory cells stacked along the channel layers. Various structures and manufacturing methods have been developed to improve the operational reliability of three-dimensional non-volatile memory devices.

SUMMARY

According to an embodiment, a method of manufacturing a semiconductor device may include forming a cell chip including a first substrate, a source layer on the first substrate, a stacked structure on the source layer, and a channel layer passing through the stacked structure and coupled to the source layer, flipping the cell chip, exposing a rear surface of the source layer by removing the first substrate from the cell chip, performing surface treatment on the rear surface of the source layer to reduce a resistance of the source layer, forming a peripheral circuit chip including a second substrate and a circuit on the second substrate, and bonding the cell chip including the source layer with a reduced resistance to the peripheral circuit chip.

According to an embodiment, method of manufacturing a semiconductor device may include forming a cell chip including a first substrate, a source layer on the first substrate, a stacked structure on the source layer, and a channel layer passing through the stacked structure and coupled to the source layer, flipping the cell chip, exposing a rear surface of the source layer by removing the first substrate from the cell chip, irradiating the source layer with a laser beam incident on the rear surface of the source layer, patterning the source layer onto which the laser beam is irradiated, forming a peripheral circuit chip including a second substrate and a circuit on the second substrate, and bonding the cell chip including a patterned source layer to the peripheral circuit chip.

According to an embodiment, a method of manufacturing a semiconductor device may include forming a cell chip including a first substrate, a patterned source layer on the first substrate, a stacked structure on the patterned source layer, and a channel layer passing through the stacked structure and coupled to the patterned source layer, flipping the cell chip, exposing the patterned source layer by removing the first substrate from the cell chip, irradiating the patterned source layer with a laser beam incident on rear surfaces of the patterned source layer, forming a peripheral circuit chip including a second substrate and a circuit on the second substrate, and bonding the cell chip including the patterned source layer of which the laser beam has irradiated to the peripheral circuit chip.

DETAILED DESCRIPTION

Hereinafter, various embodiments will be described with reference to the accompanying drawings. Embodiments may be embodied in different forms and should not be construed as limited to the embodiments set forth herein. Rather, these embodiments are provided so that this disclosure will be thorough and complete, and will fully convey the scope of the examples of the embodiments to those skilled in the art.

It is also noted that in this specification, "connected/coupled" refers to one component not only directly coupling another component but also indirectly coupling another component through an intermediate component. In the specification, when an element is referred to as "comprising" or "including" a component, it does not exclude other components but may further include other components unless a description to the contrary is specifically pointed out in context.

Various embodiments of the present disclosure may provide a method of manufacturing a semiconductor device with easy manufacturing processes, a stabilized structure and improved characteristics.

Figure 1:
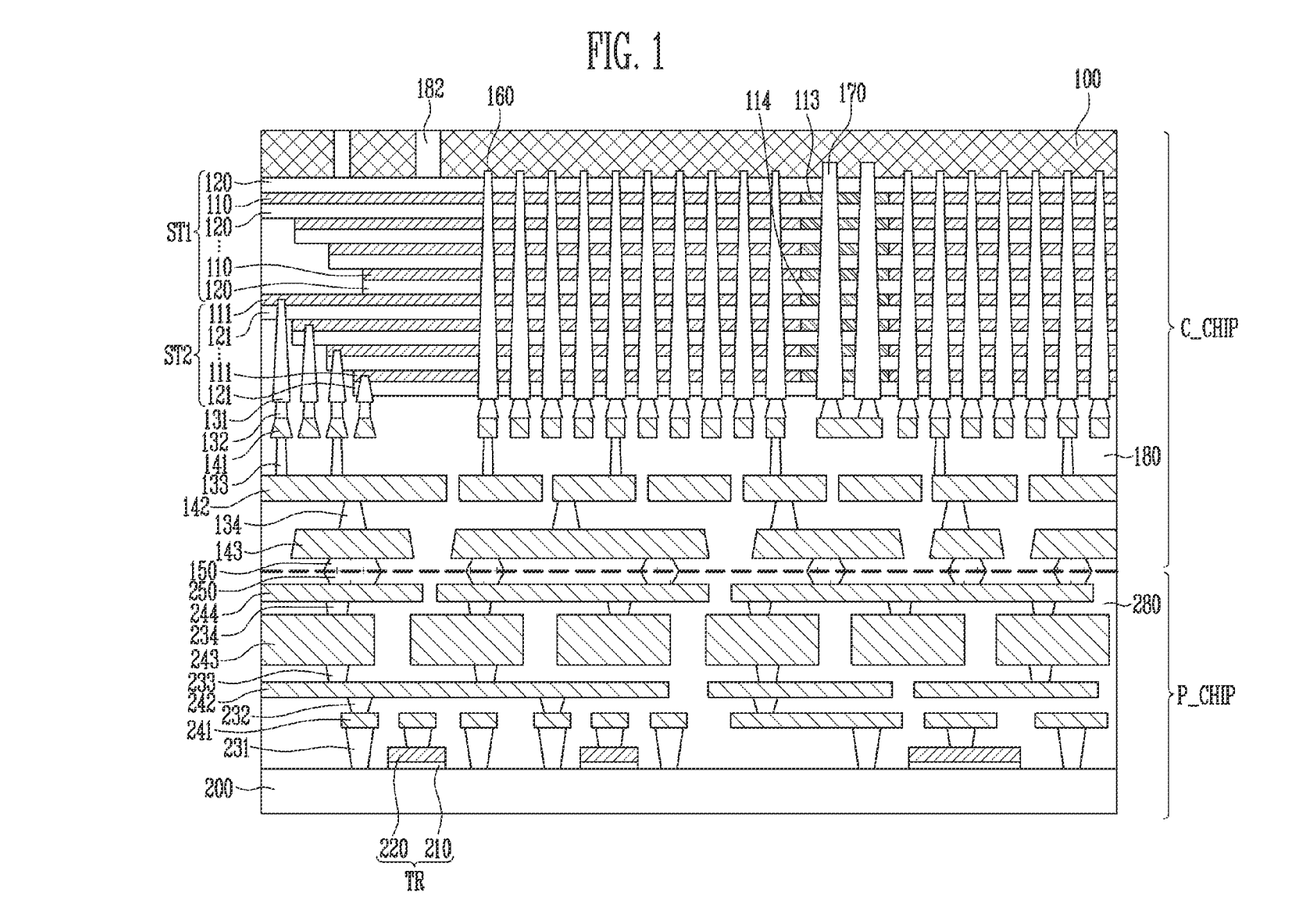
FIG. 1 is a cross-sectional diagram illustrating the structure of a semiconductor device according to an embodiment.

FIG. 1 is a cross-sectional diagram illustrating the structure of a semiconductor device according to an embodiment.

Referring to FIG. 1, a semiconductor device according to an embodiment may include a cell chip C_CHIP and a peripheral circuit chip P_CHIP bonded to the cell chip C_CHIP. The cell chip C_CHIP may be located above the peripheral circuit chip P_CHIP. On the other hand, the peripheral circuit chip P_CHIP may be located above the cell chip C_CHIP.

The cell chip C_CHIP may include a first stacked structure ST1, a second stacked structure ST2, an interconnection structure (131 to 134 and 141 to 143), a first bonding structure 150, a channel structure 160, a source contact structure 170, and a first interlayer insulating layer 180.

The first stacked structure ST1 may include first conductive layers 110 and first insulating layers 120 stacked alternately with each other. The second stacked structure ST2 may include second conductive layers 111 and second insulating layers 121 stacked alternately with each other. The first conductive layers 110 and the second conductive layers 111 may be gate electrodes such as select transistors and memory cells, and may include polysilicon, tungsten, metals, or the like. The first insulating layers 120 and the second insulating layers 121 may insulate the stacked gate electrodes from each other and include an insulating material such as an oxide or a nitride.

A portion of the first stacked structure ST1 may include first sacrificial layers 113 instead of the first conductive layers 110. In the portion of the first stacked structure ST1, the first sacrificial layers 113 and the first insulating layers 120 may be stacked alternately with each other. Similarly, in a portion of the second stacked structure ST2, second sacrificial layers 114 and the second insulating layers 121 may be stacked alternately with each other. The first and second sacrificial layers 113 and 114 may include a dielectric material such as a nitride.

The first stacked structure ST1 may include a cell region in which memory strings are located and a contact region to which an interconnection structure is connected. The second stacked structure ST2 may include a cell region and a contact region. The contact region of each of the first and second stacked structures ST1 and ST2 may have a stepped structure.

The first stacked structure ST1 and the second stacked structure ST2 may be vertically stacked on each other. For example, the first stacked structure ST1 may be located above the second stacked structure ST2. In addition, the cell region of the first stacked structure ST1 and the cell region of the second stacked structure ST2 may overlap with each other in a stacking direction, and the contact region of the first stacked structure ST1 and the contact region of the second stacked structure ST2 may overlap each other in the stacking direction.

A source layer 100 may be located on the first stacked structure ST1. The source layer 100 may be a polysilicon layer. The source layer 100 may be patterned and an insulating layer 182 may fill space between neighboring source layers 100. The insulating layer 182 may be located at positions corresponding to the contact regions of the first and second stacked structures ST1 and ST2.

The source layer 100 may have a resistance reduced by surface treatment. For example, the source layer 100 may be a polysilicon layer with an increased grain size. The surface treatment may be laser irradiation, dopant implantation or heat treatment.

Dopants may be N type impurities or P type impurities. The source layer 100 may contain N type impurities or P type impurities according to an erase operation method. When the semiconductor device performs an erase operation by supplying holes using the source layer 100, the source layer 100 may include P type impurities. When the semiconductor device performs an erase operation by supplying holes using a gate induced drain leakage (GIDL) current, the source layer 100 may include N type impurities.

The channel structure 160 may penetrate the first and second stacked structures ST1 and ST2. The channel structure 160 may be coupled to the source layer 100 and protrude into the source layer 100. The channel structure 160 may include a channel layer and a memory layer surrounding a sidewall of the channel layer. In addition, the channel layer may include a semiconductor material such as silicon (Si), germanium (Ge) or the like. The memory layer may include at least one of a tunnel insulating layer, a data storage layer and a charge blocking layer. The data storage layer may include a floating gate, a charge trapping material, silicon, a nitride, nanodots, a variable resistance material, and a phase change material. In addition, the channel structure 160 may further include a gap-filling insulating layer formed in the channel layer and an epitaxial semiconductor layer coupling the channel layer and the source layer 100.

The source contact structure 170 may penetrate the first and second stacked structures ST1 and ST2 and be coupled to the source layer 100. The source contact structure 170 may protrude into the source layer 100 to a greater depth than the channel structure 160. In addition, the source contact structure 170 may have a greater diameter than the channel structure 160.

The source contact structure 170 may penetrate the first conductive layers 110, the first insulating layers 120, the second conductive layers 111 and the second insulating layers 121, or may penetrate the first sacrificial layers 113, the first insulating layers 120, the second sacrificial layers 114 and the second insulating layers 121. When the first sacrificial layers 113 are replaced with the first conductive layers 110, portions of the first sacrificial layers 113 may remain. When the second sacrificial layers 114 are replaced with the second conductive layers 111, portions of the second sacrificial layers 114 may remain.

The source contact structure 170 may include a contract plug which includes a conductive material such as polysilicon, tungsten or metal. In addition, the source contact structure 170 may further include an insulating spacer surrounding a sidewall of the contact plug, and the insulating spacer may include an insulating material such as an oxide or a nitride.

The interconnection structure (131 to 134 and 141 to 143) may include first, second, third and fourth contact plugs 131, 132, 133, and 134 and first, second and third wires 141, 142, 143. The interconnection structure (131 to 134 and 141 to 143) may be formed in the first interlayer insulating layer 180. In FIG. 1, the first interlayer insulating layer 180 may be illustrated as a single layer. However, the first interlayer insulating layer 180 may include insulating layers stacked on each other.

The first contact plugs 131 may be coupled to the first or second conductive layers 110 or 111 stacked on each other, respectively. The second contact plugs 132 may be coupled to the first contact plugs 131, the channel structures 160, or the source contact structures 170. The second contact plugs 132 may electrically couple the first contact plugs 131 and the first wires 141. The third contact plugs 133 may be coupled to the first wires 141 and electrically couple the first wires 141 and the second wires 142. The fourth contact plugs 134 may be coupled to the second wires 142 and electrically couple the second wires 142 and the third wires 143.

The first bonding structure 150 may electrically couple the cell chip C_CHIP to the peripheral circuit chip P_CHIP.

The first bonding structure 150 may be in the form of a contact plug or a wire. The first bonding structures 150 may be electrically coupled to the third wires 143.

The peripheral circuit chip P_CHIP may include a circuit for operating the memory strings included in the cell chip C_CHIP. The peripheral circuit chip P_CHIP may include a transistor TR, a circuit, a capacitor, a resistor, etc. The peripheral circuit chip P_CHIP may include a substrate 200, the transistor TR, an interconnection structure (231 to 234 and 241 to 243), a second bonding structure 250, and a second interlayer insulating layer 280.

The transistor TR may include a gate electrode 220 and a gate insulating layer 210. The gate insulating layer 210 may be interposed between the substrate 200 and the gate electrode 220. Though not shown in FIG. 2, the transistor TR may further include a junction in the substrate 200.

The interconnection structure (231 to 234 and 241 to 143) may include fifth, sixth, seventh and eighth contact plugs 231, 232, 233 and 234 and fourth, fifth and sixth wires 241, 242 and 243. The interconnection structure (231 to 234 and 241 to 243) may be formed in the second interlayer insulating layer 280. In FIG. 2, the second interlayer insulating layer 280 may be illustrated as a single layer. However, the second interlayer insulating layer 280 may include insulating layers stacked on each other.

The fifth contact plugs 231 may be coupled to the gate electrode 220 or the junction of the transistor TR. The fourth wires 241 may be electrically coupled to the fifth contact plugs 231. The sixth contact plugs 232 may electrically couple the fourth wires 241 and the fifth wires 242. The seventh contact plugs 233 may electrically couple the fifth wires 242 and the sixth wires 243. The eighth contact plugs 234 may electrically couple the sixth wires 243 and the seventh wires 244.

The second bonding structure 250 may electrically couple the cell chip C_CHIP to the peripheral circuit chip P_CHIP. The second bonding structure 250 may be in the form of a contact plug or a wire. The second bonding structures 250 may be electrically coupled to the seventh wires 244. The second bonding structures 250 may be bonded to the first bonding structures 150 of the cell chip C_CHIP. Therefore, the cell chip C_CHIP and the peripheral circuit chip P_CHIP may be electrically coupled to each other through the first and second bonding structures 150 and 250. For example, by bonding the first bonding structures 150 and the second bonding structures 250 to each other and bonding the first interlayer insulating layer 180 and the second interlayer insulating layer 280 to each other, the cell chip C_CHIP and the peripheral circuit chip P_CHIP may be coupled to each other. As a result, the first and second stacked structures ST1 and ST2 may be located between the substrate 200 and the source layer 100.

According to the above-described structure, the cell chip C_CHIP and the peripheral circuit chip P_CHIP may be manufactured separately and then bonded to each other. In addition, since the source layer 100 has an increased grain size, the resistance of the source layer 100 may be reduced. Therefore, source bouncing during an operation of a semiconductor device may be reduced.

FIGS. 2A to 2D are cross-sectional views illustrating a method of manufacturing a semiconductor device according to an embodiment.

Figure 2A:
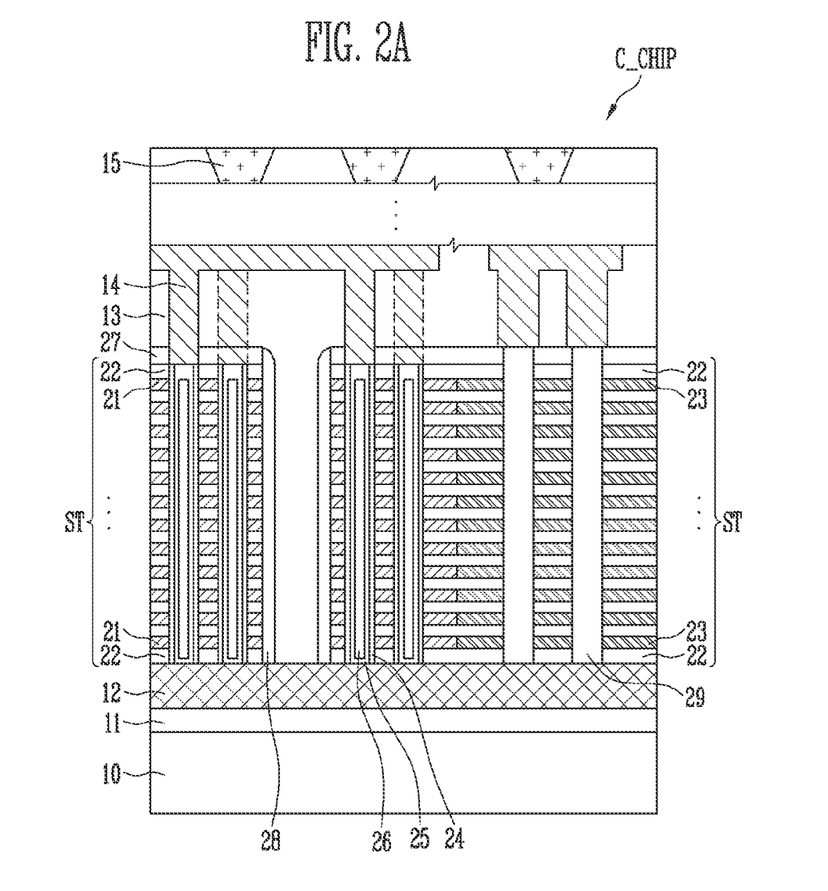
FIGS. 2A to 2D are cross-sectional views illustrating a method of manufacturing a semiconductor device according to an embodiment.

Referring to FIG. 2A, the cell chip C_CHIP may be formed. The cell chip C_CHIP includes a first substrate 10, a source layer 12, a stacked structure ST and a channel layer 25. The cell chip C_CHIP may further include insulating layers 11 and 27, a spacer 28, an interlayer insulating layer 13, an interconnection structure 14 and a first bonding structure 15.

A method of forming the cell chip C_CHIP will be described below.

First, after the insulating layer 11 is formed on the first substrate 10, the source layer 12 may be formed on the insulating layer 11. The insulating layer 11 may include an oxide layer or a nitride layer. The source layer 12 may be a polysilicon layer.

The stacked structure ST may be formed on the source layer 12. The stacked structure ST may include first material layers 23 and second material layers 22 which are stacked alternately with each other. The first material layers 23 may be provided to form gate electrodes of memory cells, select transistors and the like. The second material layers 22 may be provided to insulate the stacked gate electrodes from each other. The first material layers 23 may include a material having high etch selectivity with respect to the second material layers 22. For example, the first material layers 23 may be sacrificial layers including nitrides or the like, and the second material layers 22 may be insulating layers including oxides or the like. Alternatively, the first material layers 23 may be conductive layers including polysilicon, tungsten, or the like, and the second material layers 22 may be insulating layers including oxides or the like. In another example, each of the first material layers 23 may be a conductive layer including doped polysilicon, and each of the second material layers 22 may be a sacrificial layer including undoped polysilicon.

After openings are formed through the stacked structure ST, channel structures may be formed in the openings. Each of the channel structures may include a channel layer 25, a memory layer 24 surrounding the channel layer 25, and a gap-filling insulating layer 26 in the channel layer 25. FIG. 2A briefly shows how the channel layer 25 and the source layer 12 are coupled to each other. However, the channel layer 25 may protrude into the source layer 12, or may be coupled to the source layer 12 through an epitaxial semiconductor layer.

After openings are formed through the stacked structure ST, source contact structures 29 may be formed in the openings. Each of the source contact structures 29 may include a contact plug and may further include an insulating spacer surrounding a sidewall of the contact plug. The source contact structures 29 may protrude into the source layer 12.

After the insulating layer 27 is formed on the stacked structure ST, a slit may be formed through the insulating layer 27 and the stacked structure ST. The first material layers 23 or the second material layers 22 may be replaced by third material layers 21. For example, when the first material layers 23 are sacrificial layers and the second material layers 22 are insulating layers, the first material layers 23 may be replaced by conductive layers. In another example, when the first material layers 23 are conductive layers and the second material layers 22 are insulating layers, the first material layers 23 may be silicided. In another example, when the first material layers 23 are conductive layers and the second material layers 22 are sacrificial layers, the second material layers 22 may be replaced by insulating layers. FIG. 2A shows that the first material layers 23 are replaced by conductive layers. The first material layers 23 may remain in a portion of the stacked structure ST.

After the spacer 28 is formed on an inner wall of the slit, the interlayer insulating layer 13 may be formed in the slit.

The interlayer insulating layer 13 may fill the slit and be formed on the stacked structure ST. However, instead of filling the interlayer insulating layer 13 in the slit, a conductive plug may be formed therein. In addition, the interlayer insulating layer 13 may include a plurality of insulating layers and include the interconnection structure 14. The interconnection structure 14 may be electrically coupled to the channel layer 25 and the source contact structure 29.

Another interconnection structure may be further formed and the first bonding structures 15 electrically coupled to the interconnection structure may be formed.

In an earlier described embodiment, the stacked structure ST may be formed on the source layer 12. However, the stacked structure ST may be formed on a source sacrificial layer. The source sacrificial layer may be replaced by the source layer 12 through a slit. In addition, in an earlier described embodiment, the channel structure, the source contact structure 29 and the third material layers 21 are described as being formed in a sequential manner. However, they may be formed in a different order.

Figure 2B:
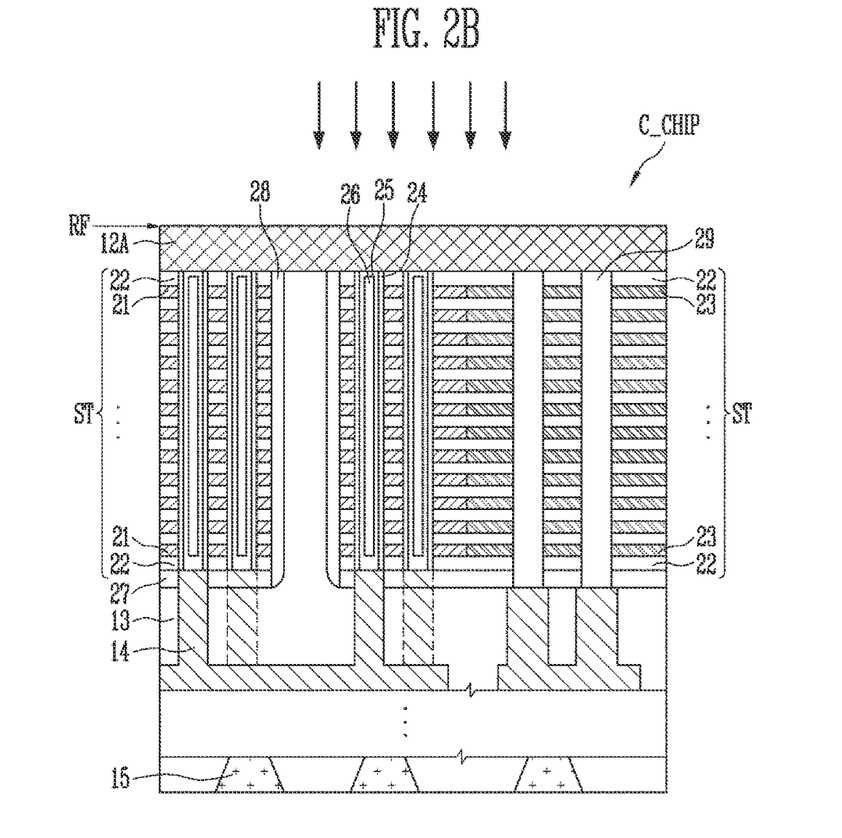

Referring to FIG. 2B, by flipping the cell chip C_CHIP, the first substrate 10 may be located over the stacked structure ST. In other words, a rear surface of the first substrate 10 may be exposed.

A rear surface RF of the source layer 12 may be exposed by removing the first substrate 10. For example, after the insulating layer 11 is exposed by removing the first substrate 10, the source layer 12 may be exposed by removing the insulating layer 11. The first substrate 10 may be removed by a grinding method. The insulating layer 11 may be removed by a wet etch process.

The rear surface RF of the source layer 12 may be subject to surface treatment. The rear surface RF of the source layer 12 may be subjected to surface treatment by laser irradiation, dopant implantation, or heat treatment after dopant implantation. As a result, a source layer 12A having a reduced resistance may be formed. When the source layer 12 includes a polysilicon layer, a grain size of the polysilicon layer may be increased by a surface treatment process. In other words, the surface-treated source layer 12A may have a greater grain size than the source layer 12 formed by a deposition process. In addition, depending on conditions of a laser irradiation process, the grain size may be increased to a level of a single crystal.

Figure 2C:
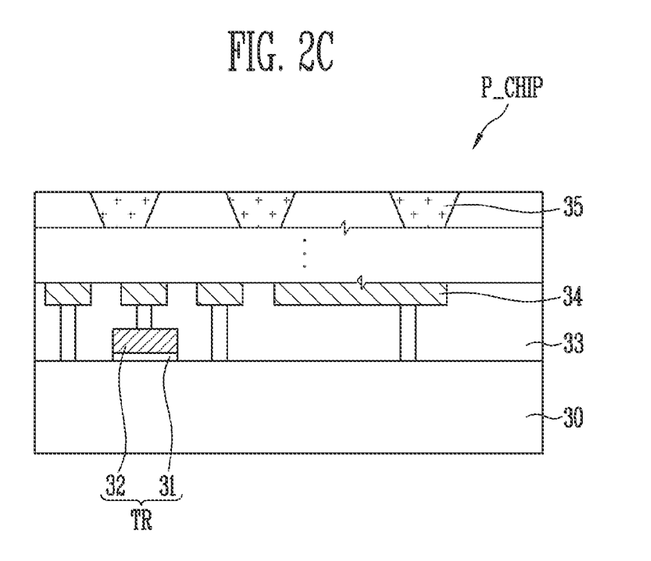

Referring to FIG. 2C, the peripheral circuit chip P_CHIP may be formed. The peripheral circuit chip P_CHIP may include a second substrate 30 and a peripheral circuit. First, the peripheral circuit may be formed on the second substrate 30. For example, the transistor TR may include a gate electrode 32 and a gate insulating layer 31. An interlayer insulating layer 33 and an interconnection structure 34 may be formed. The interconnection structure 34 may be electrically coupled to the gate electrode 32 of the transistor TR.

Another interconnection structure may be further formed. Second bonding structures 35 electrically coupled to this interconnection structure may be formed.

Figure 2D:
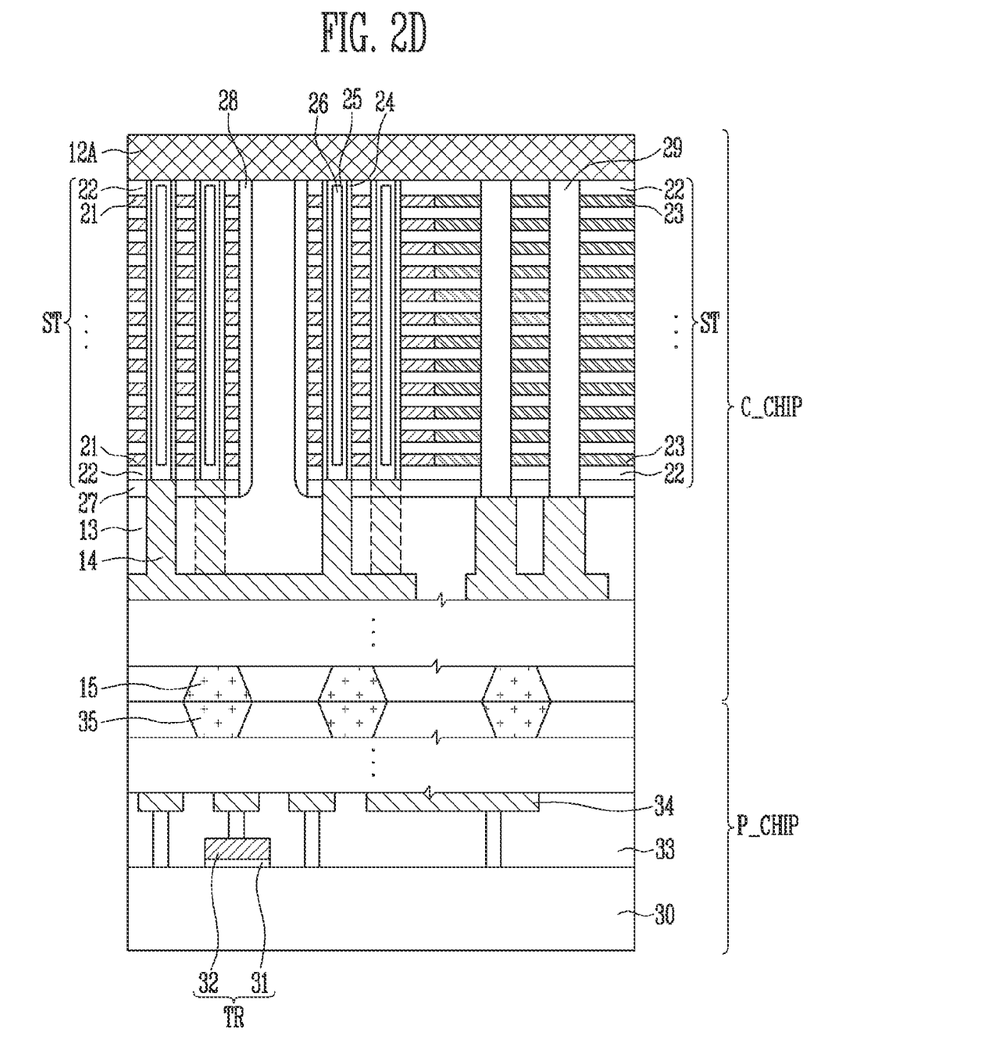

Referring to FIG. 2D, the cell chip C_CHIP and the peripheral circuit chip P_CHIP may be bonded to each other. The cell chip C_CHIP and the peripheral circuit chip P_CHIP may be bonded so that the stacked structure ST may be located between the source layer 12A and the second substrate 30. For example, the cell chip C_CHIP and the peripheral circuit chip P_CHIP may be bonded so that the first bonding structures 15 of the cell chip C_CHIP and the second bonding structures 35 of the peripheral circuit chip P_CHIP may contact each other. As a result, the cell chip C_CHIP and the peripheral circuit chip P_CHIP may be electrically coupled to each other.

According to the above-described manufacturing method, since the first substrate 10 is removed after the cell chip C_CHIP is flipped, the rear surface RF of the source layer 12 may be easily exposed. Since surface treatment is performed on the rear surface RF of the source layer 12, processes may be more simplified as compared when surface treatment is performed on the entire surface of the source layer 12 on which the stacked structure ST is formed. In addition, since the rear surface RF of the source layer 12 is subjected to surface treatment, the source layer 12A with reduced resistance may be formed.

Figure 3A:
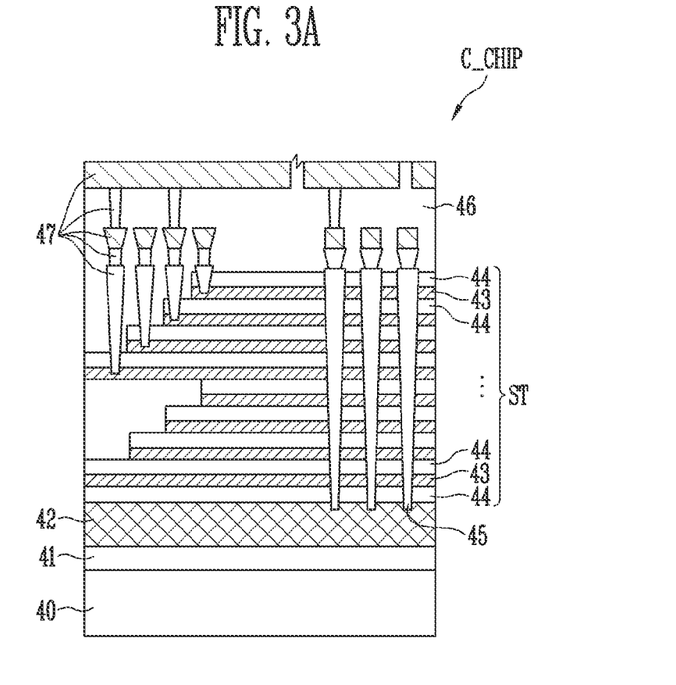
FIGS. 3A to 3C are cross-sectional views illustrating a method of manufacturing a semiconductor device according to an embodiment.
Figure 3B:
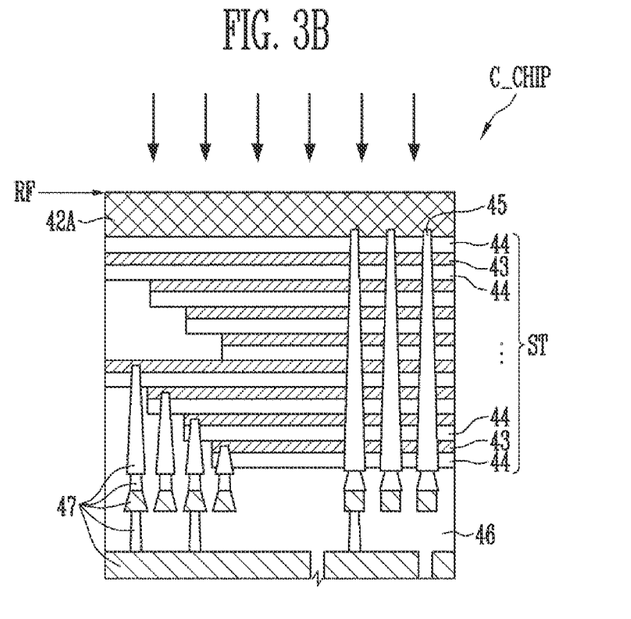
Figure 3C:
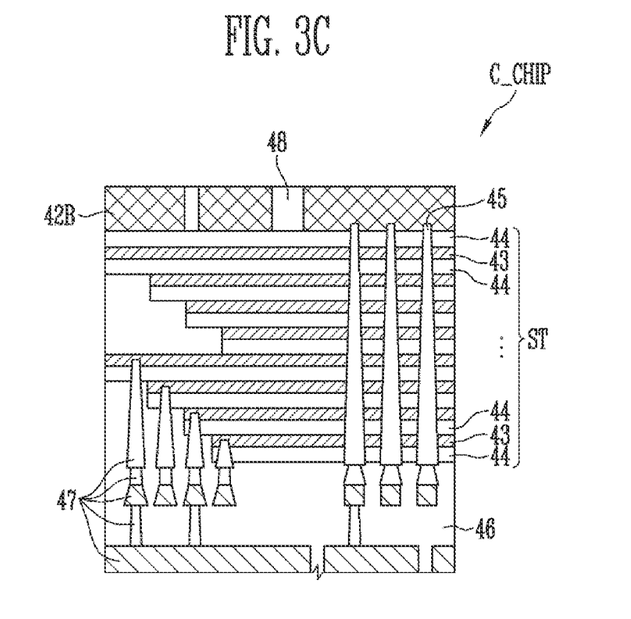

FIGS. 3A to 3C are cross-sectional views illustrating a method of manufacturing a semiconductor device according to an embodiment.

Referring to FIG. 3A, the cell chip C_CHIP may be formed. The cell chip C_CHIP may include a first substrate 40, an insulating layer 41, a source layer 42, the stacked structure ST, a channel structure 45, an interlayer insulating layer 46, and an interconnection structure 47. In addition, the stacked structure ST may include conductive layers 43 and insulating layers 44 stacked alternately with each other.

Since a method of forming the cell chip C_CHIP is similar to or the same as described above with reference to FIG. 2A, any repetitive description thereof will be omitted.

Referring to FIG. 3B, after the cell chip C_CHIP is flipped, the first substrate 40 and the insulating layer 41 may be removed. As a result, a rear surface RF of the source layer 42 may be exposed. By performing surface treatment on the source layer 42, resistance of the source layer 42 may be reduced.

For example, a laser may irradiate the source layer incident on the source layer 42. The polysilicon layer may be melted by laser irradiation and may then be cooled down. In some embodiments, the polysilicon layer may be instantaneously melted by laser irradiation and may then be cooled down. As a result, the polysilicon layer may be recrystallized and the grain size thereof may be increased. Therefore, a source layer 42A with the increased gain size may be formed.

In another example, dopants may be implanted into the rear surface RF of the source layer 42. For example, after dopants are implanted into the source layer 42 using an ion implantation process, a heat treatment process may be performed thereon. The source layer 42 may have conductivity by the dopants and the dopants may be activated by the heat treatment process.

Process conditions including time and temperature of the surface treatment process may be controlled by the thickness or material of the source layer 42.

Referring to FIG. 3C, the surface-treated source layer 42A may be patterned. A plurality of source layers 42B may be formed by etching the source layer 42A. An insulating layer 48 may be formed between neighboring source layers 42B.

Though not shown in FIG. 3C, the cell chip C_CHIP including the patterned source layer 42B and the peripheral circuit chip may be bonded to each other.

According to the above-described process, a patterning process may be performed by reducing the resistance of the source layer 42. Therefore, the entire rear surface RF of the source layer 42 may be subjected to surface treatment. In addition, a separate mask might not be used to limit a surface treatment area.

Figure 4A:
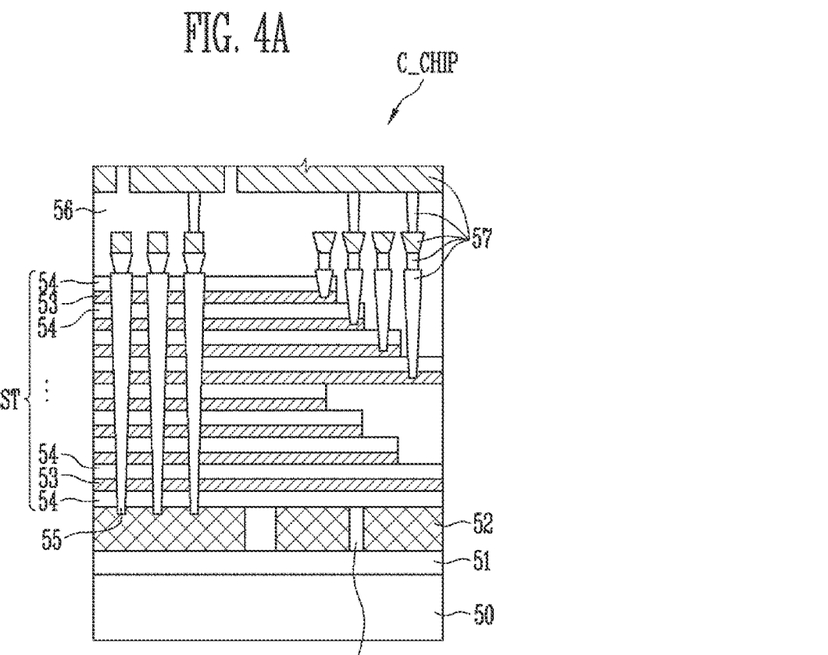
FIGS. 4A and 4B are cross-sectional views illustrating a method of manufacturing a semiconductor device according to an embodiment.
Figure 4B:
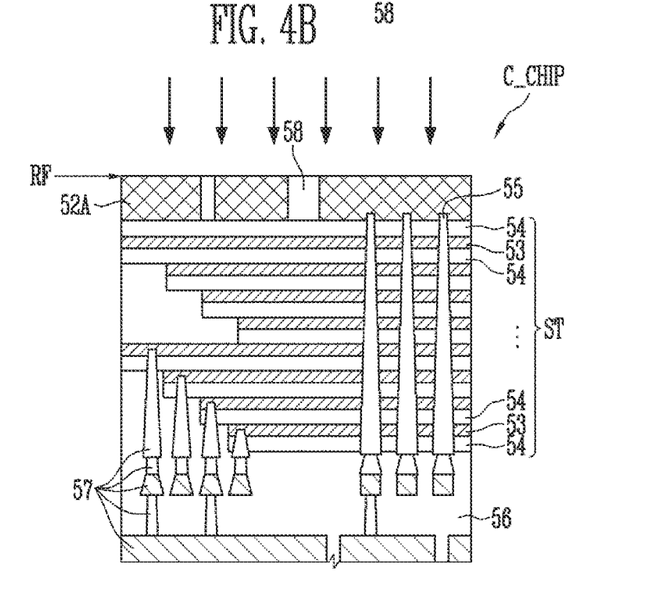

FIGS. 4A and 4B are cross-sectional views illustrating a method of manufacturing a semiconductor device according to an embodiment.

Referring to FIG. 4A, the cell chip C_CHIP may be formed. The cell chip C_CHIP may include a first substrate 50, an insulating layer 51, a patterned source layer 52, the stacked structure ST, a channel structure 55, an interlayer insulating layer 56, and an interconnection structure 57. In addition, the stacked structure ST may include conductive layers 53 and insulating layers 54 stacked alternately with each other.

The source layer 52 may be patterned when the cell chip C_CHIP is formed. For example, after the insulating layer 51 is formed on the first substrate 50, the source layer 52 may be formed on the insulating layer 51. After a plurality of source layers 52 may be formed by patterning the source layer 52, an insulating layer 58 may be formed between neighboring source layers 52. The stacked structure ST may be formed on the patterned source layer 52.

For example, after the insulating layer 51 is formed on the first substrate 50, a source sacrificial layer may be formed on the insulating layer 51. After the source sacrificial layer is patterned, the insulating layer 58 may be formed between neighboring source sacrificial layers. After the stacked structure ST and the channel structure 55 are formed on the patterned source sacrificial layer, the source sacrificial layer may be replaced by the source layer 52.

Since a method of forming the cell chip C_CHIP is similar to or the same as described above with reference to FIG. 2A, any repetitive description thereof will be omitted.

Referring to FIG. 4B, the cell chip C_CHIP including the patterned source layer 52 may be reversed. After the insulating layer 51 is exposed by removing the first substrate 50, a rear surface RF of the patterned source layer 52 may be exposed by removing the insulating layer 51.

By performing surface treatment on the rear surface RF of the patterned source layer 52, resistance of the patterned source layer 52 may be reduced.

For example, a laser beam may be irradiated onto the rear surface RF of the patterned source layer 52. By instantaneously melting the polysilicon layer and cooling the same, the grain size may be increased. As a result, a source layer 52A with the increased gain size may be formed.

In another example, dopants may be implanted into the rear surface RF of the patterned source layer 52. For example, after dopants are implanted into the patterned source layer 52 using an ion implantation process, a heat treatment process may be performed thereon. The patterned source layer 52 may have conductivity by the dopants and the dopants may be activated by the heat treatment process. The dopants may be implanted into the insulating layer 58 as well as the patterned source layer 52. However, the dopants implanted into the insulating layer 58 might not affect the characteristics of the semiconductor device. Therefore, it might not be necessary to add a separate mask for dopant implantation.

Though not shown in FIG. 4B, the cell chip C_CHIP including the surface-treated source layer 52B and the peripheral circuit chip may be bonded to each other.

According to the above-described processes, the source layer 52 may be patterned when the cell chip C_CHIP is formed. Therefore, the patterned source layer 52 may be exposed by removing the first substrate 50 and surface treatment may be performed on the rear surface RF of the source layer 52 without a separate mask.

Figure 5:
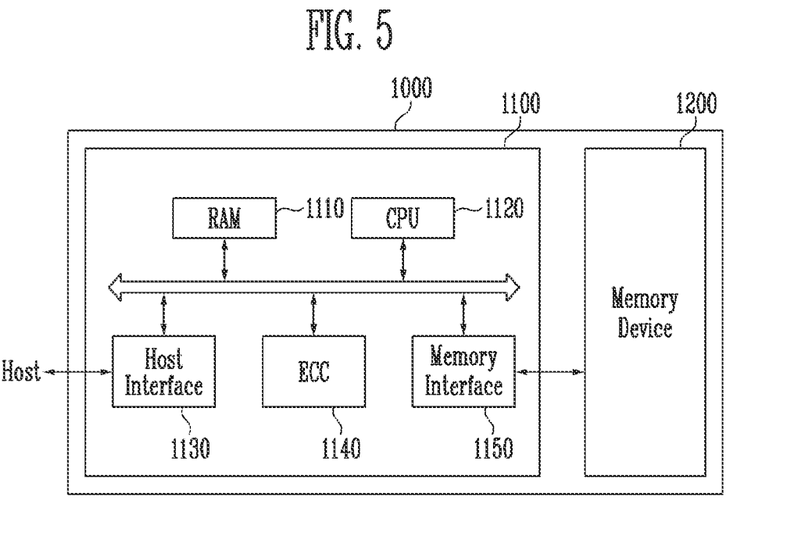
FIGS. 5 and 6 are block diagrams illustrating the configuration of a memory system according to an embodiment of the present disclosure.

FIG. 5 is a block diagram illustrating a memory system 1000 according to an embodiment.

As illustrated in FIG. 5, the memory system 1000 according to an embodiment may include a memory device 1200 and a controller 1100.

The memory device 1200 may be used to store various types of data such as text, graphic, and software code. The memory device 1200 may be a non-volatile memory device. In addition, the memory device 1200 may include the above configurations described with reference to FIGS. 1 to 4B, and may be manufactured by the methods described with reference to FIGS. 1 to 4B. Since the memory device 1200 is configured and manufactured in the same manner as described above, a detailed description thereof will be omitted.

The controller 1100 may be coupled to a host and the memory device 1200 and configured to access the memory device 1200 in response to a request from the host. For example, the controller 1100 may control read, write, erase, and background operations of the memory device 1200.

The controller 1100 may include a random access memory (RAM) 1110, a central processing unit (CPU) 1120, a host interface 1130, an error correction code (ECC) circuit 1140, and a memory interface 1150.

The RAM 1110 may serve as an operation memory of the CPU 1120, a cache memory between the memory device 1200 and the host, a buffer memory between the memory device 1200 and the host, or the like. For reference, the RAM 1110 may be replaced with a static random access memory (SRAM), a read only memory (ROM), or the like.

The CPU 1120 may control the overall operation of the controller 1100. For example, the CPU 1120 may operate firmware such as a flash translation layer (FTL) stored in the RAM 1110.

The host interface 1130 may interface with the host. For example, the controller 1100 may communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The ECC circuit 1140 may use an error correction code (ECC) to detect and correct errors in data read from the memory device 1200.

The memory interface 1150 may interface with the memory device 1200. For example, the memory interface 1150 may include a NAND interface or a NOR interface.

For reference, the controller 1100 may further include a buffer memory (not shown) for temporarily storing data. The buffer memory may be used to temporarily store data to be transferred from the host interface 1130 to an external device or data to be transferred from the memory interface 1150 to the memory device 1200. The controller 1100 may further include a ROM which stores code data to interface with the host.

Since the memory system 1000 according to the embodiments may include the memory device 1200 having improved integration density and characteristics, the memory system 1000 may also have improved integration density and characteristics accordingly.

Figure 6:
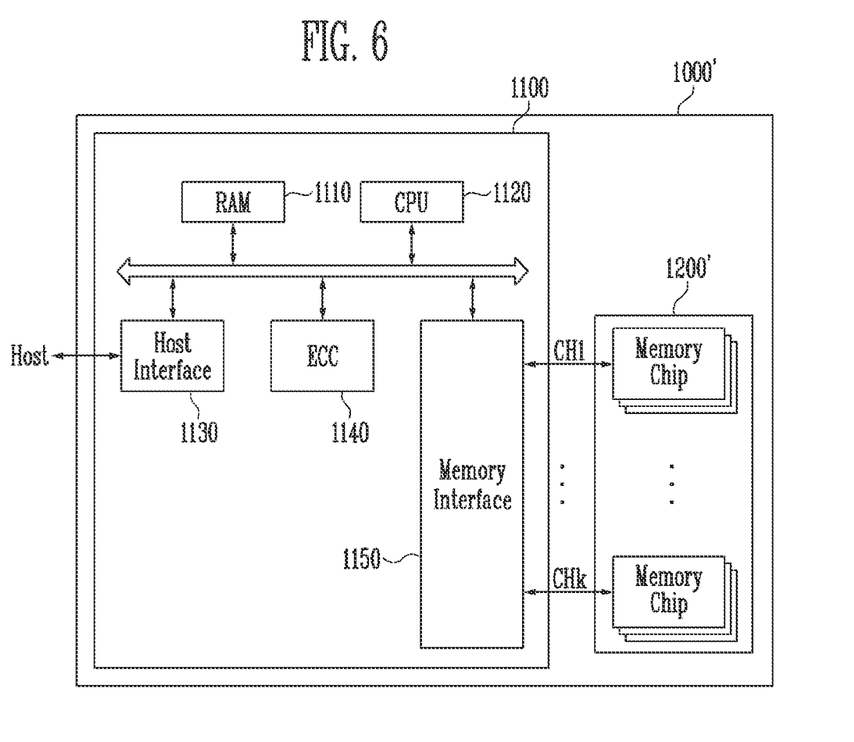

FIG. 6 is a block diagram illustrating the configuration of a memory system 1000' according to an embodiment of the present disclosure. Hereinafter, any repetitive detailed description of components already mentioned above will be omitted.

Referring to FIG. 6, the memory system 1000' according to an embodiment may include a memory device 1200' and the controller 1100. The controller 1100 may include the RAM 1110, the CPU 1120, the host interface 1130, the ECC circuit 1140 and the memory interface 1150.

The memory device 1200' may be a non-volatile memory device. In addition, the memory device 1200' may include the above configurations described with reference to FIGS. 1 to 4B, and may be manufactured by the methods described with reference to FIGS. 1 to 4B. Since the memory device 1200' is configured and manufactured in the same manner as described above, a detailed description thereof will be omitted.

Furthermore, the memory device 1200' may be a multi-chip package including a plurality of memory chips. The plurality of memory chips may be divided into a plurality of groups, which may communicate with the controller 1100 through first to kth channels CH1 to CHk, respectively. In addition, memory chips, included in a single group, may be suitable for communicating with the controller 1100 through a common channel. For reference, the memory system 1000' may be modified such that each memory chip is coupled to a corresponding single channel.

Since the memory system 1000' according to the embodiments may include the memory device 1200' having improved integration and characteristics, the integration and characteristics of the memory system 1000' may also be improved. In addition, since the memory device 1200' is formed into a multi-chip package, data storage capacity and driving speed of the memory system 1000' may be further increased.

Figure 7:
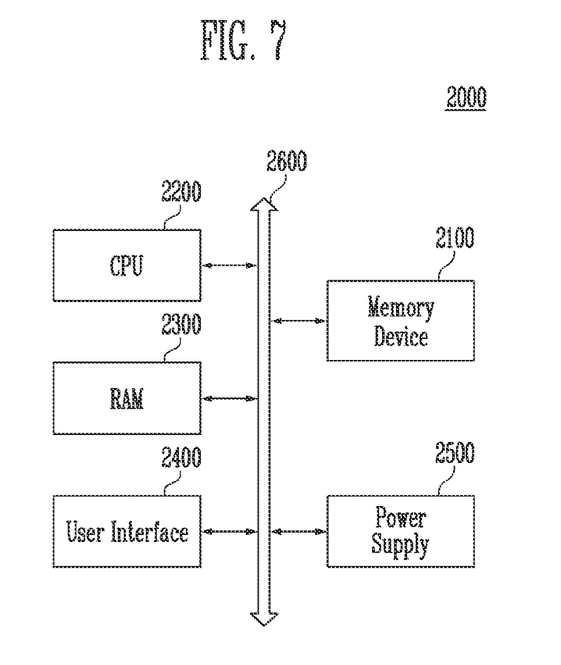
FIGS. 7 and 8 are block diagrams illustrating the configuration of a computing system in accordance with an embodiment of the present disclosure.

FIG. 7 is a block diagram illustrating the configuration of a computing system 2000 according to an embodiment of the present disclosure. Hereinafter, any repetitive detailed description of components already mentioned above will be omitted.

As illustrated in FIG. 7, the computing system 2000 may include a memory device 2100, a CPU 2200, a random-access memory (RAM) 2300, a user interface 2400, a power supply 2500 and a system bus 2600.

The memory device 2100 may store data provided via the user interface 2400, data processed by the CPU 2200, etc. The memory device 2100 may be electrically coupled to the CPU 2200, the RAM 2300, the user interface 2400, and the power supply 2500 by the system bus 2600. For example, the memory device 2100 may be coupled to the system bus 2600 via a controller (not shown), or directly to the system bus 2600. When the memory device 2100 is directly coupled to the system bus 2600, functions of the controller may be performed by the CPU 2200 and the RAM 2300.

The memory device 2100 may be a nonvolatile memory. In addition, the memory device 2100 may include the above configurations described with reference to FIGS. 1 to 4B, and may be manufactured by the methods described with reference to FIGS. 1 to 4B. Since the memory device 2100 is configured and manufactured in the same manner as described above, a detailed description thereof will be omitted.

As described above with reference to FIG. 6, the memory device 2100 may be a multi-chip package configured with a plurality of memory chips.

The computing system 2000 having the above-mentioned configuration may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, or the like.

As described above, since the computing system 2000 according to the embodiments may include the memory device 2100 having improved integration and characteristics, the characteristics of the computing system 2000 may also be improved.

Figure 8:
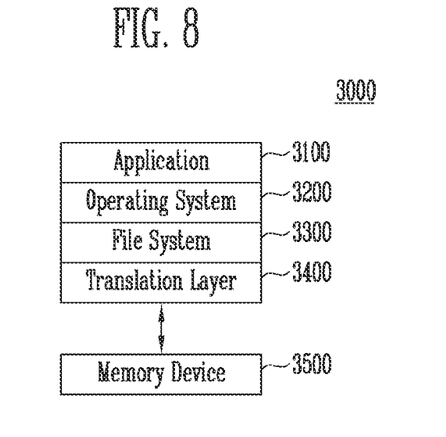

FIG. 8 is a block diagram illustrating a computing system 3000 according to an embodiment.

As illustrated in FIG. 8, the computing system 3000 according to an embodiment may include a software layer that has an operating system 3200, an application 3100, a file system 3300, and a translation layer 3400. The computing system 3000 may include a hardware layer such as a memory device 3500.

The operating system 3200 may manage software and hardware resources of the computing system 3000. The operating system 3200 may control program execution of a central processing unit. The application 3100 may include various application programs executed by the computing system 3000. The application 3100 may be a utility executed by the operating system 3200.

The file system 3300 may refer to a logical structure configured to manage data and files present in the computing system 3000. The file system 3300 may organize files or data and store them in the memory device 3500 according to given rules. The file system 3300 may be determined depending on the operating system 3200 used in the computing system 3000. For example, when the operating system 3200 is a Microsoft Windows-based system, the file system 3300 may be a file allocation table (FAT) or an NT file system (NTFS). In addition, the operating system 3200 is a Unix/Linux system, the file system 3300 may be an extended file system (EXT), a Unix file system (UFS), a journaling file system (JFS), or the like.

FIG. 8 illustrates the operating system 3200, the application 3100, and the file system 3300 in separate blocks. However, the application 3100 and the file system 3300 may be included in the operating system 3200.

The translation layer 3400 may translate an address into a suitable form for the memory device 3500 in response to a request from the file system 3300. For example, the translation layer 3400 may translate a logic address, generated by the file system 3300, into a physical address of the memory device 3500. Mapping information of the logical address and the physical address may be stored in an address translation table. For example, the translation layer 3400 may be a flash translation layer (FTL), a universal flash storage link layer (ULL), or the like.

The memory device 3500 may be a nonvolatile memory. In addition, the memory device 3500 may include the above configurations described with reference to FIGS. 1 to 4B, and may be manufactured by the methods described with reference to FIGS. 1 to 4B. Since the memory device 3500 is configured and manufactured in the same manner as described above, a detailed description thereof will be omitted.

The computing system 3000 having the above-described configuration may be divided into an operating system layer that is operated in an upper layer region and a controller layer that is operated in a lower level region. The application 3100, the operating system 3200, and the file system 3300 may be included in the operating system layer, and may be driven by an operating memory of the computing system 3000. The translation layer 3400 may be included in the operating system layer or the controller layer.

As described above, since the computing system 3000 according to the embodiments may include the memory device 3500 having improved integration density and characteristics, characteristics of the computing system 3000 may also be improved.

In accordance with various embodiments, a semiconductor device having a stabilized structure and improved reliability may be provided. In addition, a semiconductor device may be manufactured with simple processes at low cost.

Examples of embodiments have been disclosed herein, and although specific terms are employed, they are used and are to be interpreted in a generic and descriptive sense only and not for purpose of limitation. In some instances, as would be apparent to one of ordinary skill in the art as of the effective filing date of the present patent document, features, characteristics, and/or elements described in connection with a particular embodiment may be used singly or in combination with features, characteristics, and/or elements described in connection with other embodiments unless otherwise specifically indicated. Accordingly, it will be understood by those skilled in the art that various changes in forms and details may be made without departing from the spirit and scope of the present disclosure as set forth in the following claims.

What is claimed is:

1. A method of manufacturing a semiconductor device, the method comprising:
   forming a cell chip including a first substrate, a polysilicon layer on the first substrate, and a stacked structure on the polysilicon layer, wherein the stacked structure includes memory cells stacked on top of one another;
   flipping the cell chip;
   exposing a rear surface of the polysilicon layer by removing the first substrate from the cell chip;
   irradiating the polysilicon layer with a laser beam incident on the rear surface of the polysilicon layer;
   forming a peripheral circuit chip including a second substrate and a circuit on the second substrate; and
   bonding the cell chip including the polysilicon layer irradiated with the laser beam to the peripheral circuit chip.

2. The method of claim 1, wherein a resistance of the polysilicon layer is reduced by irradiating the polysilicon layer with the laser beam.

3. The method of claim 1, further comprising:
   patterning the polysilicon layer onto which the laser beam is irradiated.

4. The method of claim 1, wherein a grain size of the polysilicon layer is increased by laser irradiation.

5. A method of manufacturing a semiconductor device, the method comprising:
   forming a cell chip including a first substrate, a polysilicon layer on the first substrate, and a stacked structure on the polysilicon layer, wherein the stacked structure includes memory cells stacked on top of one another;
   flipping the cell chip;
   exposing a rear surface of the polysilicon layer by removing the first substrate from the cell chip;
   performing surface treatment on the rear surface of the polysilicon layer by implanting dopants into the rear surface of the polysilicon layer;
   forming a peripheral circuit chip including a second substrate and a circuit on the second substrate; and
   bonding the cell chip including the polysilicon layer implanted with the dopants to the peripheral circuit chip.

6. The method of claim 5, further comprising:
   after the dopants are implanted into the polysilicon layer, performing a heat treatment to activate the dopants.

7. The method of claim 1, wherein a resistance of the polysilicon layer is reduced by implanting the dopants.

8. A method of manufacturing a semiconductor device, the method comprising:
   forming a cell chip including a first substrate, a polysilicon layer on the first substrate, and a stacked structure on the polysilicon layer, wherein the stacked structure includes memory cells stacked on top of one another;
   flipping the cell chip;
   exposing a rear surface of the polysilicon layer by removing the first substrate from the cell chip;
   performing surface treatment on the rear surface of the polysilicon layer to reduce a resistance of the polysilicon layer;
   forming a peripheral circuit chip including a second substrate and a circuit on the second substrate; and
   bonding the cell chip including the polysilicon layer with a reduced resistance to the peripheral circuit chip.

9. The method of claim 8, wherein the forming of the cell chip comprises:
   forming the polysilicon layer on the first substrate;
   patterning the polysilicon layer; and
   forming the stacked structure on a patterned polysilicon layer.

10. The method of claim 8, wherein the surface treatment is performed on the polysilicon layer by irradiating the polysilicon layer with a laser beam incident on the polysilicon layer.

11. The method of claim 8, wherein the cell chip and the peripheral circuit chip are bonded so that the stacked structure is located between the polysilicon layer and the second substrate.

12. The method of claim 8, further comprising patterning the polysilicon layer after performing the surface treatment on the rear surface of the polysilicon layer.

13. The method of claim 8, wherein a grain size of the polysilicon layer is increased by the surface treatment.

14. The method of claim 8, wherein the performing of the surface treatment on the polysilicon layer comprises:
   implanting a dopant into the polysilicon layer; and
   performing heat treatment on the polysilicon layer into which the dopant is implanted.

15. The method of claim 14, wherein the dopant contains an N type impurity or a P type impurity.

16. The method of claim 8, wherein the cell chip is formed so that the stacked structure is located on the patterned polysilicon layer.

17. The method of claim 16, wherein the surface treatment is performed on a rear surface of the patterned polysilicon layer.

18. The method of claim 8, wherein the cell chip further includes an insulating layer interposed between the first substrate and the polysilicon layer.

19. The method of claim 18, wherein the exposing of the rear surface of the polysilicon layer comprises:
   exposing the insulating layer by removing the first substrate; and
   exposing the polysilicon layer by removing the insulating layer.

20. The method of claim 19, wherein the insulating layer is removed by a wet etch process.

\* \* \* \* \*